United States Patent
Liu et al.

(10) Patent No.: US 7,012,974 B1
(45) Date of Patent: Mar. 14, 2006

(54) HIGH RATE PRODUCT CODE DECODING FOR PARTIAL RESPONSE CHANNEL

(75) Inventors: Cathy Ye Liu, San Jose, CA (US); Charles E. MacDonald, Los Gatos, CA (US); Joseph P. Caroselli, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 848 days.

(21) Appl. No.: 09/961,596

(22) Filed: Sep. 24, 2001

(51) Int. Cl.
    *H03D 1/00* (2006.01)

(52) U.S. Cl. .................. 375/340; 375/341; 714/804
(58) Field of Classification Search .............. 375/242, 375/262–265, 340–341, 240.24, 290; 369/53.35; 714/791–796, 802, 804
    See application file for complete search history.

(56) References Cited

U.S. PATENT DOCUMENTS

| 6,185,175 B1 * | 2/2001 | Zook ...................... 369/53.35 |
| 6,320,916 B1 * | 11/2001 | Kobayashi et al. .......... 375/341 |
| 6,434,719 B1 * | 8/2002 | Livingston .................. 714/804 |

* cited by examiner

*Primary Examiner*—Young T. Tse
*Assistant Examiner*—Edith Chang
(74) *Attorney, Agent, or Firm*—Suiter West Swantz PC LLO (57) ABSTRACT

The present invention is directed to a detector for a high-density magnetic recording channel and other partial response channels. The present invention presents a method for decoding a high rate product code and a decoder which uses this method, comprising receiving a high rate product code; using a row detector to find a most likely codeword and a most likely error sequence for each row; and using a column processor to correct any remaining errors based on column parity bits and the most likely error sequence of each row. In a first aspect of the present invention, the row detector is implemented through a 2-VA detector. In a second aspect of the present invention, the row detector is implemented through a conventional VA detector and a bank of matched filters.

17 Claims, 7 Drawing Sheets

| Algorithm | Storage (bits) | computation | |
|---|---|---|---|
| | | addition | comparison |
| VA | $2^m(n+\beta)$ | $O(2^m N)$ | $O(2^m N)$ |
| 2-VA | $2^{m+1}(n+\beta) + 2 \cdot 2^{m+1}(n+\sqrt{N})$ | $O(2^m N)$ | $O(2^m N)$ |
| SOVA | $O(2^{m+1} \cdot \beta \cdot n \cdot I)$ | $O(2^m \cdot I \cdot N)$ | $O(2^m \cdot I \cdot N)$ |
| Max-Log-MAP | $O(2^{m+1} \cdot N \cdot n \cdot I)$ | $O(2^m \cdot I \cdot N)$ | $O(2^m \cdot I \cdot N)$ |

Figure 13

HIGH RATE PRODUCT CODE DECODING FOR PARTIAL RESPONSE CHANNEL

FIELD OF THE INVENTION

The present invention generally relates to the field of high speed data communications, and particularly to magnetic recording and other partial response channels.

BACKGROUND OF THE INVENTION

The magnetic recording channel is characterized as a communication channel that has significant intersymbol interference (ISI) and allows only binary inputs. Coding for the high-density magnetic recording channel is difficult because the binary constraint prohibits constellation expansion. Because the channel sampling rate has to increase to compensate for the code rate loss, leading to increased ISI and a corresponding degradation in signal-to-noise ratio (SNR), only high rate codes are appropriate for magnetic recording channels. Because of the ISI, the channel response is typically equalized to a special partial response (PR) signal and detected with a Viterbi detector matched to the partial response channel. The performance of the detector is dominated by the minimum distance error events.

In the prior art, a single parity bit has been used to provide significant coding gain when applied to a channel with odd-weight dominant error events "+−+" and "+". By increasing the number of parity bits, even-weight dominant error events may also be eliminated. However, the greater the number of parity bits, the lower the code rate. Furthermore, the code complexity significantly increases by using more parity bits.

Turbo codes are binary concatenated convolutional codes capable of operation near Shannon capacity on additive white Gaussian noise (AWGN) channels. Parallel and serial turbo decoding has been investigated for their application to partial response channels. Unlike conventional error codes, turbo codes need not trade off code rate or code complexity for increased Euclidean distance between channel sequences. This is significant for ISI channels. However, the decoding complexity (computation and memory) and decoding delay of turbo codes is very large compared with simple parity check codes. Furthermore, the error propagation is another problem for turbo decoding.

Interleaving is the process of reordering the symbols in a group of transmitted codewords such that adjacent symbols in the data stream are not from the same codeword. The receiver reassembles the codewords when it processes the data stream. The interleaving process helps reduce the effects of burst errors (i.e., multiple errors in a row), because rearranging the codeword symbols spreads the errors among multiple codewords.

Block interleaver/deinterleavers process data in a discrete stream and are used in applications such as GSM (i.e., mobile phones) and the magnetic recording system. These functions are often used with Reed-Solomon functions or Turbo Code encoders/decoders. Many channels can be affected by burst errors, which are caused by impulse noise, such as that generated by electrical interference in copper lines and fading in wireless systems.

These burst errors are much more difficult to detect and correct than random errors. With many coding techniques, however, we only deal with random errors on channels such as Additive White Gaussian Noise (AWGN). In this case, errors occur randomly, and independent of each other, on the channel according to a probability distribution for that particular channel. Although this situation will still arise, burst errors are potentially more catastrophic.

The structure of Turbo codes is ideally suited to combat both random errors and burst errors. Interleavers are one of the main ways used to combat burst errors. Interleavers are essentially permuters, that is to say they change the order of the bits in a block. Although the Turbo Code traditionally uses convolutional constituent codes, which are stream-oriented, it takes on a block structure due to the Interleaver. Blocking delays are also introduced here.

The idea of the Interleaver is to spread the influence of each bit over a greater distance. Two identical encoders work on the same bits, but in a different order. In this manner, when one encoder produces a weak code for a set of bits, the other will produce a strong code. This combination of codes can produce a powerful combined code. Also, because the bits are in a different order, should a burst error take out a block of bits, we should still have the information in the permuted set.

In the case of the Turbo Code it is important that the Interleaver sorts the bits in a manner that lacks any apparent order. This is unlike normal Interleavers, which tend to rearrange the bits in some systematic manner. However, a systematic interleaver is easier to implement than a random interleaver. The rectangular block interleaver is the simplest interleaver, such as the product code. It is also important that N be selected to be quite large preferably N>1000, where N is the size of the Interleaver block.

It has been suggested that Turbo Codes have many features in common with 'random' block codes, which are known to approach Shannon-limit performance as the block size increases. However, these 'random' codes are not practical due to the complexity of the decoding algorithm. Turbo codes have similar performance to these codes, but they avoid the decoding complexity by employing iterative algorithms.

Traditionally, trellis codes have reduced the decoder complexity by means of the Viterbi algorithm. This continually trims the various options to be correlated with the received signal. The traditional Viterbi algorithm only provides hard output, i.e., the surviving path. To perform iterative decoding, a soft-input/soft-output algorithm is used in Turbo decoding. The decoding algorithm used in the Turbo Code is the MAP algorithm. This algorithm is based on maximum likelihood, and is a soft-input/soft-output algorithm. That is to say that it does not take an input of only 1 or 0, but several levels of quantization. There is approximately a 2–3 dB gain to be made by using a soft-input algorithm. The soft-output is a measure of the probability of a correct decision. There are some suboptimal soft-input/soft-output algorithms, such as Max-Log-MAP algorithm and Soft output Viterbi algorithm (SOVA). The iterative combining of the weak individual codes, in Turbo codes, gives rise to a strong received code. This has the dual benefit of reducing both the scope for errors and the decoder complexity, at the expense of decoding time.

The decoding algorithm used in the Turbo Code is the MAP algorithm. This algorithm is based on maximum likelihood, and is a soft-input/soft-output algorithm.

Viterbi decoding works by calculating paths and continually trimming the paths so that the size of the recorded data does not get too large. This is because Viterbi algorithms are normally used on streamed data. The Turbo Code takes on a block-like structure. The MAP algorithm requires the whole block of data before decoding can begin.

Past methods have tended to use a substantial amount of memory and have been prone to propagation errors.

SUMMARY OF THE INVENTION

Accordingly, the present invention is directed to a detector for a high-density magnetic recording channel and other partial response channels.

The present invention presents a method for decoding a high rate product code and a decoder which uses this method, comprising the steps of receiving a high rate product code, using a row detector to find the most likely codeword and the most likely error sequence for each row, and using a column processor to correct any remaining errors based on column parity bits and the most likely error sequence of each row.

In a first aspect of the present invention, the row detector is implemented through a 2-VA detector.

In a second aspect of the present invention, the row detector is implemented through a conventional VA detector and a bank of matched filters.

The present invention takes advantage of the low power design of Viterbi decoders.

The present invention has a better bit error rate and ECC failure rate than simple parity check codes and performs better than a non-iterative Turbo code.

The present invention's decoding complexity is greatly reduced with respect to Turbo decoding and does not have the error propagation problem of Turbo codes.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 13., exemplary embodiments of the present invention are shown.

Figure 1:
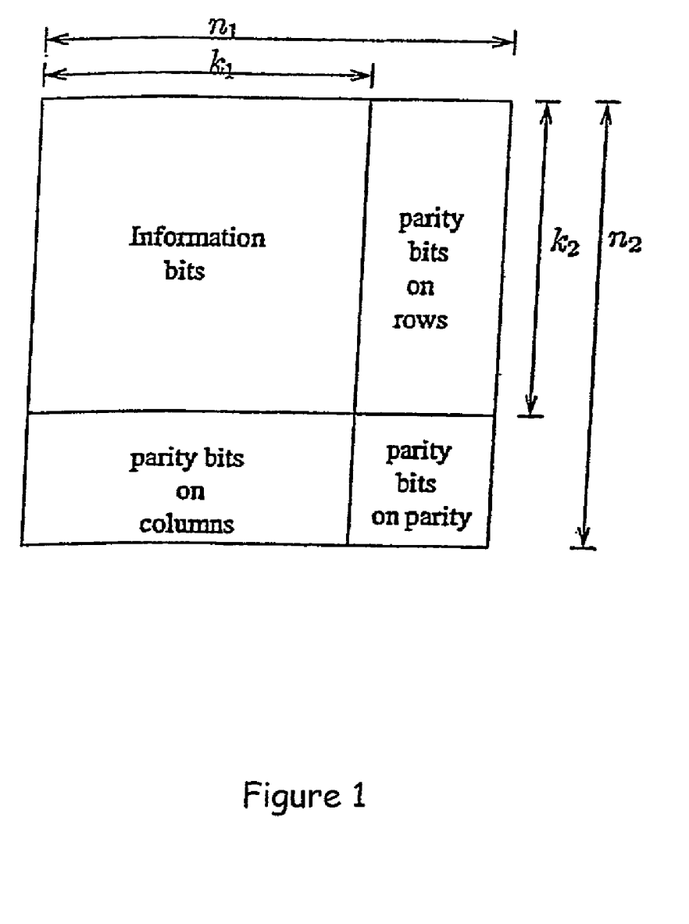
FIG. 1 illustrates the code array for product code $C_1 \times C_2$.

In the case where $C_1$ is a $(n_1, k_1)$ linear code and $C_2$ is a $(n_2, k_2)$ linear code, a $(n_1 n_2, k_1 k_2)$ linear code may be formed such that each codeword is a rectangular array of $n_1$ columns and $n_2$ rows in which every row is a codeword in $C_1$ and every column is a code word in $C_2$, as shown in FIG. 1. This two-dimensional code is called the product of $C_1$ and $C_2$. The $k_1 k_2$ digits in the upper left corner of the array are the information symbols.

The digits in the upper right corner of the array are computed from parity-check rules for $C_1$ on rows, and the digits in the lower left corner are computed from the parity-check rules for $C_2$ on columns. It can be shown that computing the check digits in the lower right corner by using the parity-check rules for $C_2$ on columns or the parity-check rules for $C_1$ on rows would yield the same $(n_1-k_1) \times (n_2-k_2)$ check digits, and it is possible to have all row codewords in $C_1$ and all column codewords in $C_2$ simultaneously.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention. Therefore, to encode the product code $C_1 \times C_2$, one may first encode the $k_2$ rows of the information array based on the parity-check rules for $C_1$ and then encode the $n_1$ resulting columns based on the rules for $C_2$, or vice versa. The code rate of the product code is $R = k_1 k_2 / n_1 n_2$.

It is not easy to characterize the correctable error patterns for the product code; this depends upon how the correction is actually done. One method involves using the correction first on rows and then on columns. In this case, a pattern will be correctable if and only if the uncorrectable patterns on row after row correction leave correctable patterns on the columns. It generally improves the correction capability by decoding rows followed by columns, then rows followed by columns again, such as iterative or turbo decoding. This increases the decoding delay and chance of error propagation.

This invention provides a high rate product code which may have a single parity bit for both row and column directions. In this case, the code rate would be $R = (n_1-1)(n_2-1)/n_1 n_2$. However, depending upon the application, it may be desirable to have more than one parity bit per row and/or per column. A non-iterative two-stage decoding algorithm minimizes decoding complexity and delay.

Figure 2:
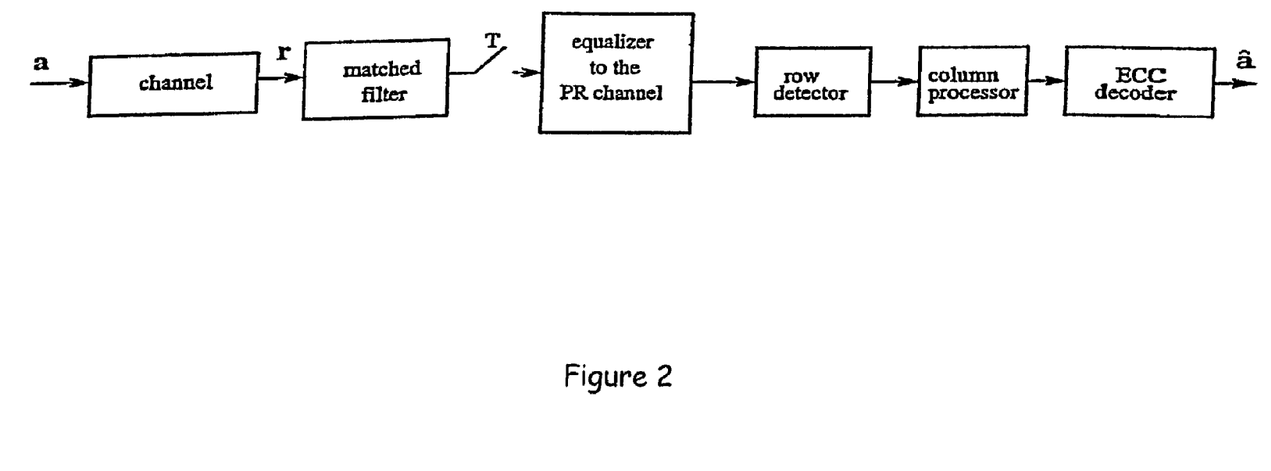
FIG. 2 illustrates a block diagram of a magnetic recording system.

The block diagram of the magnetic recording system using the product code is shown in FIG. 2. The magnetic recording channel is modeled as a read-back head plus noise. In the read-back process, for an isolated positive transition, the output voltage of the read-back head is a pulse s(t), and for a negative transition it is −s(t). This isolated transition response is well modeled as a Lorentzian pulse given by $$s(t) = 1/(1+(2t/T_{50})^2)$$

where $T_{50}$ is the width of the Lorentzian pulse at 50% amplitude level. This parameter determines the recording density of the magnetic recording system. The normalized density of the system is defined as $D = T_{50}/T$ where T is the duration of each bit interval. The noiseless read-back signal is of the form, $$r(t) = \Sigma^{\infty}_{k=-\infty} a_k h(t-kT)$$

where $a_k$ is the recorded sequence and has values $\{-1, 1\}$, $h(t) = s(t) - s(t-T)$ is the dipulse response. The noise is a magnetic recording system is a combination of media noise, head noise and thermal noise generated in the preamplifier. The latter two components can be well modeled as additive Gaussian noise. On the other hand, media noise is more complex and cannot be modeled as additive.

The receiver filters the received signal using a matched filter, samples the matched filter output at the symbol rate, equalizes the samples to the appropriate partial response target using a linear equalizer, and inputs the equalizer outputs to the channel detector. The EPR4 target of the form $(1+D-D^2-D^3)$ and the GPR target of the form $(1.5+1.0D-1.0-D^2-1.0D^3-0.5D^4)$ are usually chosen, where D is a unit delay operator. The row detector finds the most likely code and error sequences of each row in the product code by using the Viterbi decoding algorithm with the partial response target trellis. The column processor corrects remaining errors, if there are any left after the row detector, based on column parity bits and the most likely error sequence of each row. Thus, the proposed channel detector decodes the two dimensional product code in a two-stage decoding algorithm. Following the channel detector, the Error Correction Code (ECC) decoder performs forward error correction by algebraic decoding of the Reed-Solomon code.

Two practical schemes of row detector are used in the invention: 1) the two-output Viterbi row detector and 2) the conventional Viterbi detector plus a bank of matched filters and a row post processor. The two schemes use different approaches to find the most likely error sequence for each row. The second scheme does not perform as well as the first; however, it is easier to implement.

The first scheme is based on the List Viterbi algorithm (LVA). The LVA finds the ordered list of the L sequences through the trellis with the best path metrics. For the case of L=1, LVA is the same as the conventional Viterbi decoding algorithm (VA) which only finds the most likely sequence with the best path metric. For the case of L=2, LVA finds the first and second most likely sequences. The first one is the same as the output of the conventional VA. The difference between the first and the second sequences may be considered as the most likely error sequence when the first sequence is chosen as the estimated code sequence. The difference between the metrics of the first and the second code sequences may be considered as the metric of the most likely error sequence. The smaller the metric difference is, the more likely the error sequence is.

Figure 3:
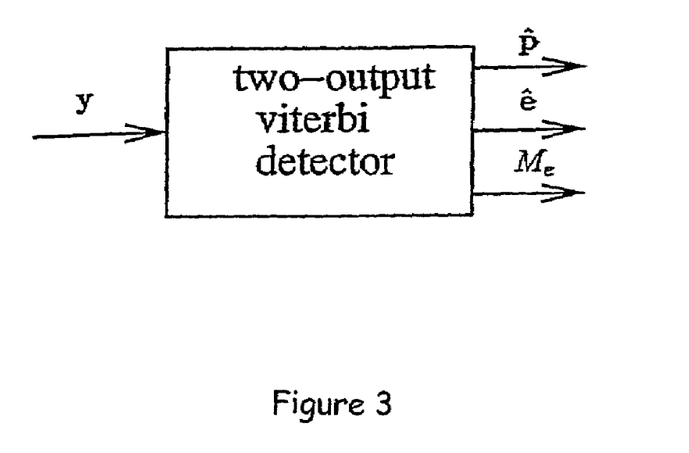
FIG. 3 illustrates a two output viterbi detector.

As shown in FIG. 3, the input into the two-output Viterbi detector is the sample sequence y. Unlike the conventional VA, 2-VA finds two estimated sequences, the most likely code sequence $p\hat{}$ and the most likely error sequence $e\hat{}$. It also generates the metric of the error sequence $M_e$.

Similar to the conventional VA detector, the 2-VA detector finds the most likely sequences through three main operations: branch metric (BM) computation, add-compare-select (ACS) recursion, and path memory. Since, BM computation only depends on the target trellis, 2-VA has the same BM unit as the conventional VA. However, it implements ACS recursion and path memory differently.

Figure 4:
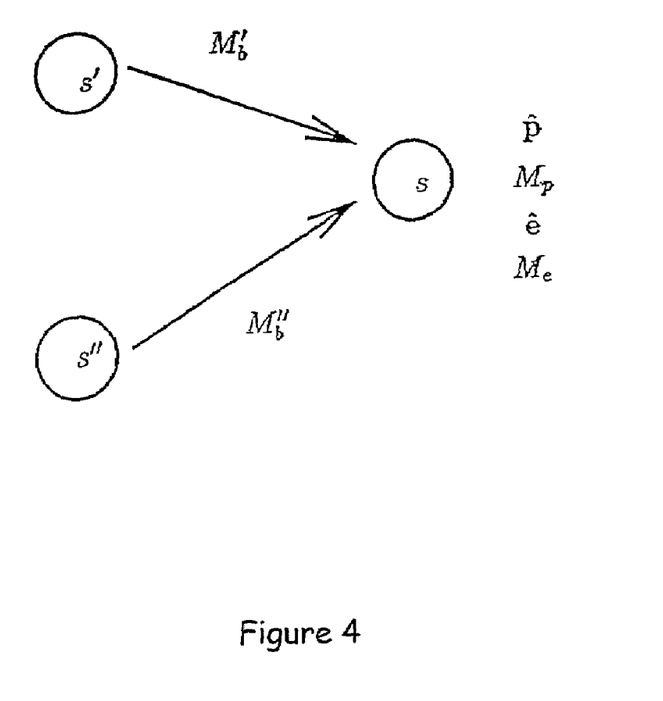
FIG. 4 illustrates a trellis state transition.

For ACS recursion, a state transition in the target trellis is shown in FIG. 4. For state s, there are two incoming branches with branch metrics $M_b'$ and $M_b''$, connecting the two previous states, s' and s", respectively. For each state, not only the surviving code path $p\hat{}$ but also the surviving error path $e\hat{}$ are stored, as well as their metrics, $M_p$ and $M_c$, respectively. $M_e'$ and $M_e''$ are both generated in the first iteration of the Viterbi add-compare-select recursion. $M_e$ is generated in the second iteration for state s. Similarly, $M_p'$ and $M_p''$; $p\hat{}'$ and $p\hat{}'''$, and $e\hat{}'$ and $e\hat{}'''$ are the first iterations of the Viterbi recursion. The ACS recursion of 2-VA may be done using the following procedure:

1. For state s, compute two incoming partial path metrics, $M_p'+M_{b'}$ and $M_p''+M_{b''}$.

2. Compare two partial path metrics and select the lower one as the surviving code path metric of s, $M_p$, and also update surviving path memory.

Let $\Delta=|(M_p'+M_b')-(M_p''+M_b'')|$.

3. Assume state s' is on the surviving path, compare $\Delta$ with $M_e'$ and select the smaller one as the error metric of state s, $M_e$, and also update error path memory as follows:

$e=\{p\hat{}\oplus p\hat{}'''$ if $\Delta<M_e'$ $e\hat{}'$ if $\Delta \geq M_e''$, A similar procedure is followed if state s" is on the surviving path rather than state s':

Compare $\Delta$ with $M_e''$ and select the smaller one as the error metric of state s, $M_e$, and also update error path memory as follows:

$e=\{p\hat{}'\oplus p\hat{}$ if $\Delta<M_e''$ $e\hat{}'$ if $\Delta \geq Me$

Figure 5:
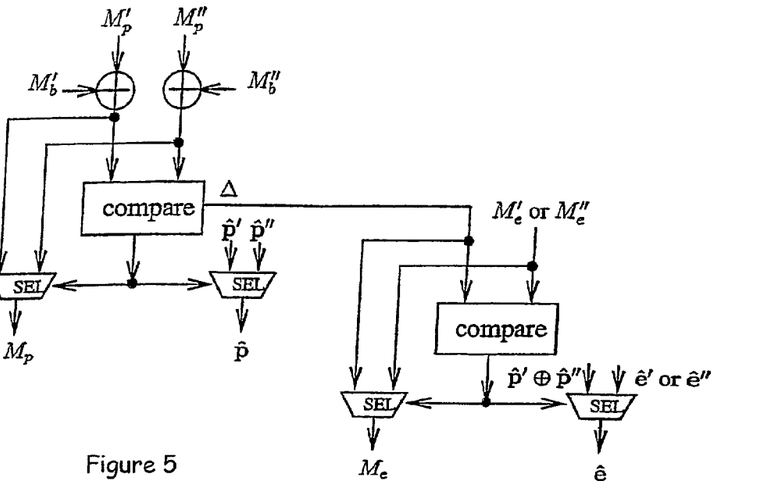
FIG. 5 illustrates an add-compare-select recursion unit for state s of a 2-VA detector.

Conceptually, 2-VA has two ACS units. One ACS unit computes the state metric and the other computes the error metric (the subtraction in 2) can be viewed as an addition). It also has two path memories, one for the code path and the other for the error path. In implementation, the subtraction in 2) can be done during the comparison of the two partial path metrics. The detail of the ACS unit is shown in FIG. 5. It is clear that the circuit of 2-VA detector is less than twice that of a conventional VA detector due to utilizing the same BM unit and the common part of the two ACS units. However, a temporary memory is required to store the surviving error path for each state at row boundaries of the product code to obtain the most likely error sequence for each row. With surviving code and error path memories and temporary memory, the 2-VA detector needs roughly three times as much memory as a conventional VA.

The symbol $\rho$ represents the number of states in the target trellis and m is the memory order of the target. For EPR4 and GPR targets, m=3 and 4, respectively. When the ACS recursion reaches the boundary of each row, each state of total $\rho$ states has its own surviving error path and metric. However, it is unknown which state is the surviving state until the ACS recursion operates $\beta$ more samples, where $\beta$ is the decoding depth of the VA. Hence, a temporary memory is required to store surviving error path for each state as well as its error metric at m bits after row boundary of the product code. Then, the error metric for each state is reset as a very large number and the ACS unit starts to find the error path for the new row. The position of m bits after a row boundary is named the reset point. After $\beta$ samples from the reset point, a min-state which has the best state metric is chosen. Then the surviving path of this min-state is traced back to the reset point and the corresponding state among the $\beta$ states is found. The error path stored in the temporary memory of the corresponding state is output as the most likely error sequence of the row, as well as the error metric. The reason to set the reset point at m bits after the row boundary but not at the row boundary is to guarantee that all non-zero bits in the error path happen at the left hand side of the row boundary, i.e., in the current row.

Figure 6:
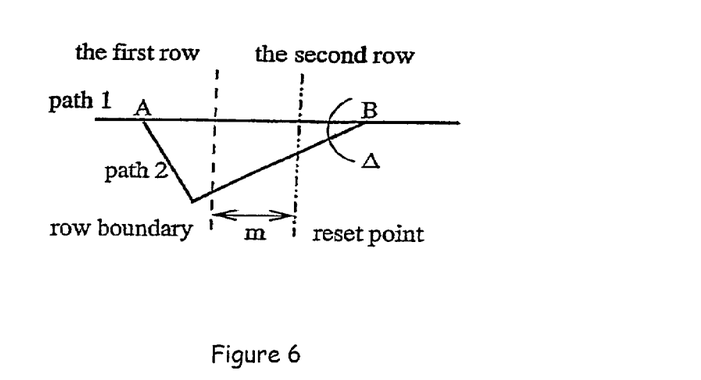
FIG. 6 illustrates a boundary error.

For those boundary events whose non-zero bits span two rows, they can be detected and chosen as the surviving error path by the second row as shown in FIG. 6. At point B in the second row where path 1 and path 2 merge, if Δ is chosen as $M_e$, the difference between the two paths is chosen as the error event. It is easy to check if the chosen error event is a boundary error or not by the location of the first mismatched bit between path 1 and path 2, i.e., point A where the two paths diverge. If point A is in the left hand side of the row boundary, it is a boundary error. Otherwise, it is not. Due to boundary errors, the length of the error path memory is a few bits longer than the row length of the product code.

The high rate product code may have one parity bit at the end of each row. For the 2-VA embodiment, the product code may have a plurality of parity bits or no parity bits at the end of each row. Preferably, the column processor may have a single parity bit per column, but may have more than one parity bit per column to make a trade off between greater error correcting capability at the expense of a lower code rate. Hence, the estimated code sequence and error sequence of each row should have even weight. To guarantee this, a trellis with parity bit built in is used for the 2-VA detector. The PR target trellis with parity check bit is the product trellis of a standard PR target trellis and a two state single parity code trellis. The number of states in the trellis is doubled due to the parity check bit. If a 2-VA detector is applied to the trellis with parity bit, the 2-VA detector finds the estimated code and error sequences both with even weight for each row. In other words, the parity constraint is guaranteed to be met in row codeword and error sequence.

Figure 7:
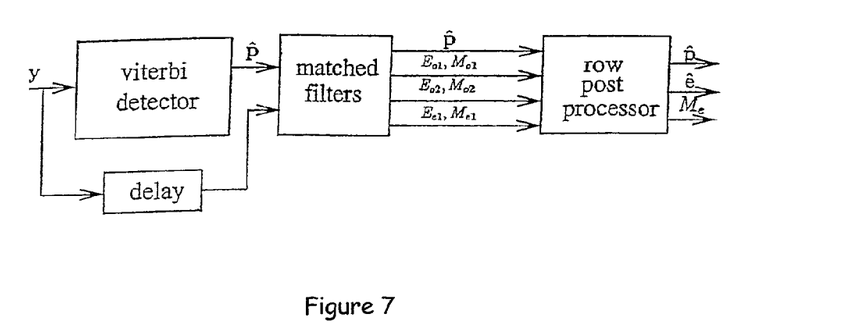
FIG. 7 illustrates a suboptimal approach with a VA detector and matched filters.

Another embodiment of this invention uses a suboptimal approach to find an even weight estimated code sequence and an even weight error sequence with its metric for each rove. The complexity is reduced through using the conventional VA detector based on a trellis without parity check to replace the 2-VA detector based on trellis with parity check. The overall detector consists of three parts: conventional VA detector, a bank of matched filters, and a row post processor as shown in FIG. 7.

This complexity-reduced detector is based on the fact that in the partial response channel a short list of error patterns dominate, and the metric of each error event may be calculated through a bank of matched filters. Each matched filter corresponds to a dominant error pattern in the list. The error metrics are then used to correct errors when the row parity condition is violated and choose the most likely error events (type and location) for column correction. The error metrics are calculated as the difference in the squared Euclidean distances between the signal y and the convolution of Viterbi data and the channel PR ($p\char`\^\cdot H$), versus that between the signal and the convolution of an alternative data pattern and the channel (($p\char`\^\oplus e_i)\cdot H$). For error event $e_i$, $Me_i\|y-(p\char`\^\oplus e_i)\cdot H\|-\|y-p\char`\^\cdot H\|$.

During each clock cycle, a matched filter calculates the metric of an error pattern in the list. At the end of each row, the two error events with the lowest metrics are chosen for each odd error pattern (with odd weight), and one error event for each even error pattern (with even weight). Normally, an odd error pattern violates the row parity condition and an even error pattern does not. However, when an error event spans two rows, an odd one may not violate the row parity, while an even one may do so. For example, if a "+−+−" error pattern starts from the last bit of the row, it violates both the current row parity and the next row parity. For another example, if a "+−+" error pattern starts from the second to the last bit of the row, it does not violate the current row parity, but does violate the next row parity. All odd error events which do not violate the current row parity and those boundary even error events which violate the current row parity are called switched error events. All non-boundary error events are non-switched. Switched odd error events, which by definition do not violate the current row parity, violate the following rows parity. Switched even error events violate, parity in both the current and succeeding rows. Then for each row, among all non-switched odd error events, switched even error events and switched odd error events from the previous row, two final odd error events $E_{o1}$ and $E_{o2}$ with the smallest metrics $M_{o1}$ and $M_{o2}$ are chosen, respectively. Among all non-switched even error events, one final even error event $E_{e1}$ with the smallest metric $M_{e1}$ is chosen. The final two odd error events are guaranteed to violate the current row parity condition, while the final even error event does not.

Meanwhile, the parity for each row of data is calculated from the Viterbi data. Then the parity, the two odd error events, and the one even, error event are input to the row processor which corrects errors to meet the row parity condition and find the most likely error sequence for each row. The procedure of the row processor is as follows:

If the parity condition is not met, p̂ is updated as $p\char`\^\oplus E_{i1}$ to enforce even row parity. The most likely error sequence is chosen as $e\char`\^=\{E_{o1}\oplus E_{o2}$ if $M_{e1} \geq M_{o2}$ $E_{e1}$ if $M_{e1} < M_{o2}$ and the metric of the most likely error sequence is $M_e = M_{o2}$ if $M_{e1} \geq M_{o2}$ $M_{e1}$ if $M_{e1} < M_{o2}$ If the parity condition is met, p̂ is the same as Viterbi data. The most likely error sequence is chosen as $e\char`\^=\{E_{o1}\oplus E_{o2}$ if $M_{e1} \geq M_{o1}+M_{o2}$ $E_{e1}$ if $M_{e1} < M_{o1}+M_{o2}$ and the metric of the most likely error sequence is $M_e = \{M_{o1}+M_{o2}$ if $M_{e1} \geq M_{o1}+M_{o2}$ $M_{e1}$ if $M_{e1} < M_{o1}+M_{o2}$ The reason for finding two odd error events $E_{o1}$ and $E_{o2}$ instead of only one is that some odd error events (such as "+−+/−+−" and "+/−") are more dominant than others and more protection of these dominant error events is desirable. If the actual error event is $E_{o2}$ and not $E_{o1}$ the row processor updates p̂ with $E_{o1}$ by mistake. However, since $E_{o1}\oplus E_{o2}$ can be chosen as the most likely error event, the column post processor still has some chance to undo a wrong connection by $E_{o1}$ and perform the right correction using $E_{o2}$.

Figure 8:
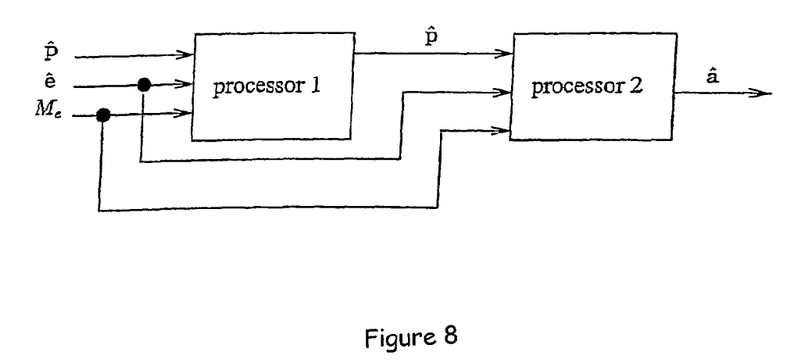
FIG. 8 illustrates a two-path column post processor.

Meanwhile, there may still be errors with even weight after processing by the 2-VA detector or row processor. A column post processor is used to correct those remaining errors based on the estimated sequence p̂ and the most likely error sequence ê for each row. First, check sums for n1 columns of p̂ are calculated. These $n_1$ check sums form a $n_1$-tuple vector which is called the column syndrome, denoted CS. If CS=0, the whole product code is considered error free; otherwise, errors are detected. The syndrome CS also provides the post processor information, about vertical positions where errors are located. However, it can not directly tell which row is in error. The procedure for finding the erroneous rows is as follows:

1. Calculate the check sums between CS and e^ of each row.
2. Compare the number of 1s in each check sum vector, and find the one with the minimum. Then, the corresponding row is chosen as the erroneous row. If there is more than one row with the minimum number of 1s, the one with the minimum $M_e$ is chosen as the erroneous row.
3. Correct the erroneous row by p^⊕e^.
4. Recalculate CS, if CS=0, the post processor is done. Otherwise, repeat steps 1, 2, and 3.

Based on the above procedure, the proposed column post processor consists of two identical processors as shown in FIG. 8. This column processor can correct two rows in errors, each column processor being able to correct one error event per row. Therefore, if there is only one error event in p^ and it is corrected by the first stage column processor, processor 1, the column syndrome CS will be zero. Then, p^ is considered error free and decoding is terminated. On the other hand, if there are two rows in error or two error events in p◯ the calculated CS will not be zero since only one of the errors has been corrected. The next stage column processor then repeats steps 1, 2, and 3. Most of the time, the second error event will be corrected by the second stage column processor, processor 2. To correct more than two rows in error, three or more processors may be concatenated. However, the chance of error propagation increases with the number of processors. For high SNR, one processor may be sufficient.

In the magnetic recording industry, different coding and detection schemes are normally compared against each other using bit error rate (BER) versus SNR curves. Other performance criteria may also be used.

Figure 9:
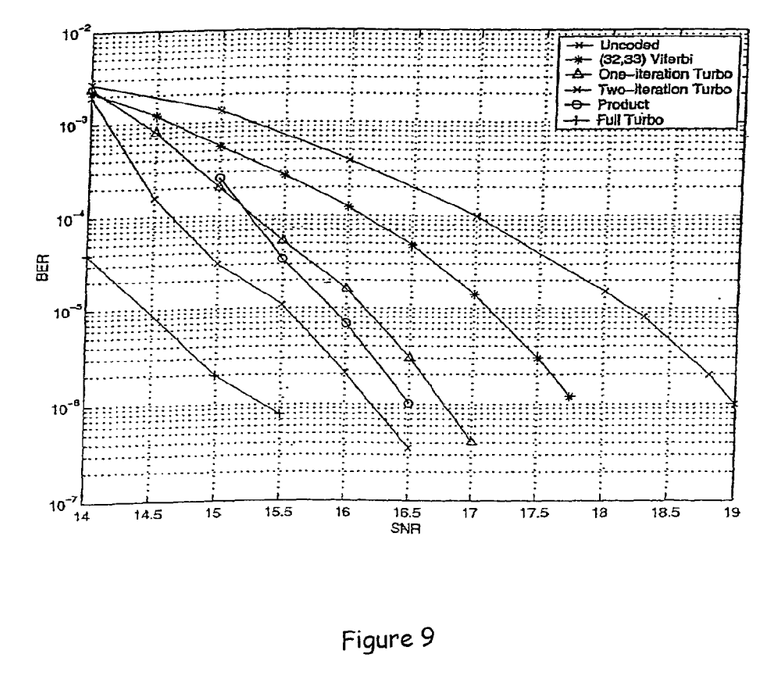
FIG. 9 illustrates a bit error rate versus SNR graph of turbo and product codes.

FIG. 9 compares the product code BER against the BERs of other decoding methods. In FIG. 9, the product code curve presents the performance for the product code of $k_1=k_2=32$, $n_1=n_2=33$ decoded with 2-VA detector over the Lorentzian channel of $T_{50}=3.0$. A 20-tap equalizer is used to equalize the received samples to the GPR target. The product code performs 1.25 dB better than the single parity check code and 0.25 dB better than the one-iteration turbo coding at $10^{-6}$ BER.

Figure 10:
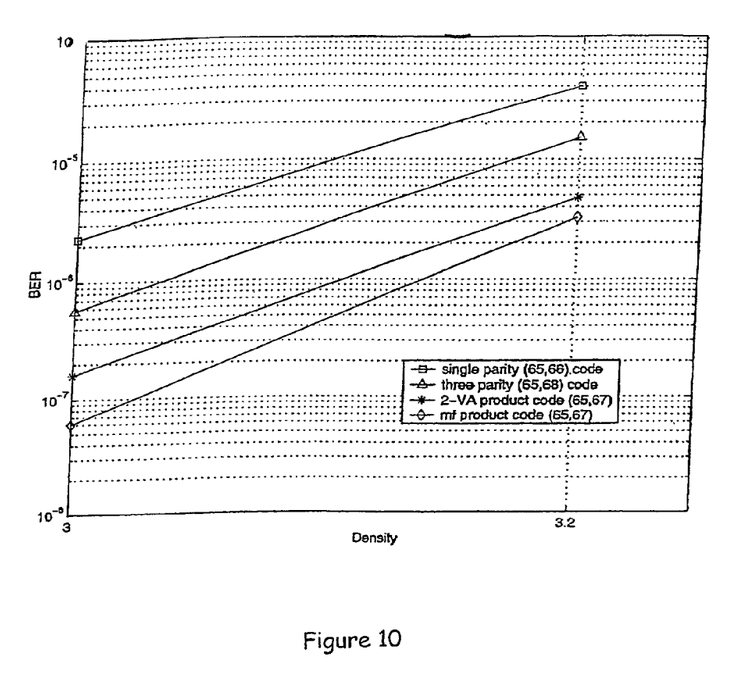
FIG. 10 illustrates a bit error rate versus density graph of the product code over a blended noise dominant channel.

FIG. 10 shows the BER performances of single parity code, three-bit three-way interleaved parity check code and the product code over a blended noise dominant channel at a user density of 3.0 and 3.2. A 20-tap equalizer is used to equalize the received samples to the GPR target. The product code has a higher code rate and performs much better than single parity or three parity bit codes. The performance degradation caused by using suboptimal matched filters to replace 2-VA detector is close to a factor of 2.

Figure 11:
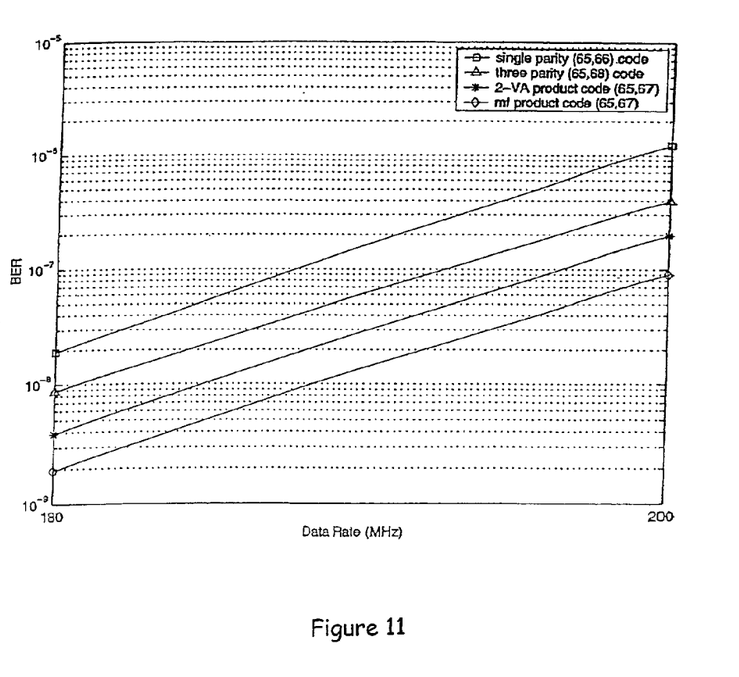
FIG. 11 illustrates a bit error rate versus data rate graph over a medium noise dominant channel.

FIG. 11 illustrates BER performances over a medium noise dominant channel at data rate of 200 MHz and 180 MHz.

Figure 12:
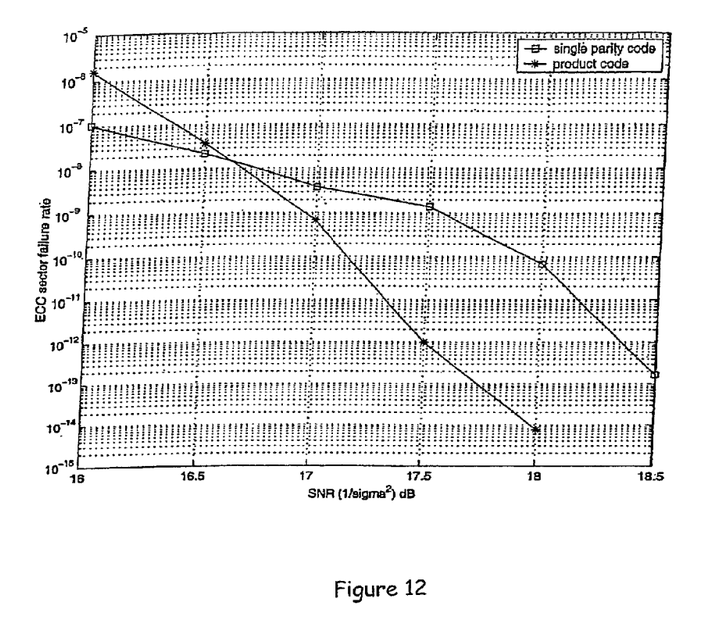
FIG. 12 illustrates an ECC sector failure rate versus SNR graph of the product code.

Multi-bit parity codes outperform a single parity code in BER, while their performance is worse with respect to the ECC Failure Rate, EFR. This is because the multiple parity code has fewer errors overall than the single parity code, but the probability of a larger error burst is higher. A statistical model to predict the EFR of the invention is used. The EFRs of the single parity code and the product code are shown in FIG. 12. It is over the Lorentzian channel of $T_{50}=3.0$. A 20-tap equalizer is used to equalize the received samples to the GPR target. For EFR below $10^{-8}$, the product code of the invention outperforms the single parity code.

The product code of the invention is more likely to generate short burst errors. However, the turbo code decoding is more likely to generate random errors instead of burst errors due to the random interleaves between two component codes. Even though the total number of bits in error of turbo decoding is less than the product of the invention, its EFR may be worse. This is because the FCC is powerful in correcting burst errors, but relatively weak in correcting random errors. Furthermore, the higher error propagation of turbo code also makes EFR higher.

Figure 13:
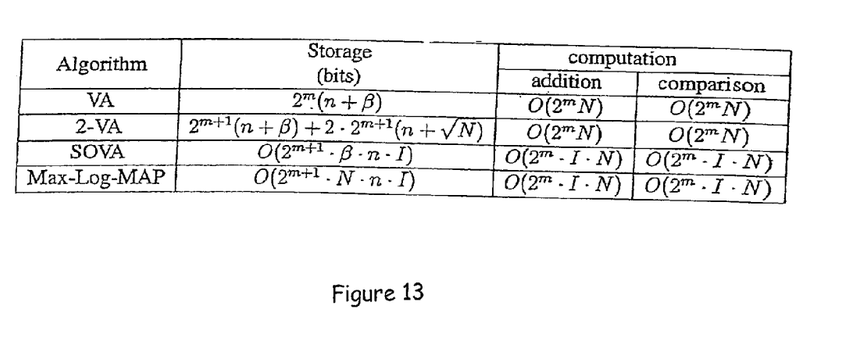
FIG. 13 illustrates a complexity comparison between the invention and two turbo decoders.

FIG. 13 illustrates a complexity comparison for VA, 2-VA, and turbo decoders. Let m be the memory order of the PR channel, β be the decoding depth of the VA, N be the sector size, n be the number of bits required for state metric, and I be the average number of iterations in turbo decoding. Only suboptimal SOVA and Max-Log-MAP decoders are considered for turbo decoding, since optimal MAP decoding requires multiplications and other more complicated real operations which make it not practical. The computational complexity of the turbo decoder is roughly 1 times as VA and 2-VA decoder, while the storage requirement is much larger. For example, for m=4, β=16, n=10, N=4096, and I=3, VA and 2-VA decoders require 416 and 5,568 bits to store respectively, while SOVA and Max-Log-MAP decoders require 15,360 and 2,621,440 bits to store respectively.

The product code system of the invention with 2-VA decoding or suboptimal matched filters is far simpler than turbo code decoding for partial response channels. This simpler system offers significant coding gains over uncoded system or parity check codes with respect to BER and EFR.

It is believed that the high rate product code decoding for a partial response channel of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

The invention claimed is:

1. A method for decoding a high rate product code, comprising the steps of:
   receiving the high rate product code;
   using a row detector to find a most likely codeword and a most likely error sequence for each row including a step of performing add-compare-select recursion; and
   using a column processor to correct any remaining errors based on column parity bits and the most likely error sequence of each row,
   wherein the step of performing the add-compare-select recursion involves two first iterations Me' and Me" and a second iteration Me of error sequence metric, two first iterations Mb' and Mb" and a second iteration icon Mb of branch metric, two first iterations Mp' and Mp" and a second iteration Mp of a surviving code path metric, two first iterations p^' and p^ and a second iteration p^ of a surviving code, and two first iterations p^' and p^" and a second iteration e^ of a surviving error path,
   wherein the step of performing the add-compare-select recursion, first, involves a step of computing two incoming partial path metrics Mp'+Mb' and Mp" +Mb";
   wherein the step of performing compare-select recursion second, involves a step of comparing the two incoming partial path metrics and selecting a better one as the second iteration surviving code path metric Mp and updating a surviving path memory and calculating $\Delta = |(Mp'-Mb')-(Mp''+Mb'')|$;

wherein the step of performing the add-compare-select recursion, third involves, if a first surviving state s' is on me surviving code metric selecting the smaller of $\Delta$ and Me' n the error sequence metric Me, or if a second switching state s" is on the surviving code path metric, selecting the smaller of $\Delta$ and Me" as the error sequence metric Me, and wherein, the step of performing the add-compare-select recursion, fourth, involves the surviving error path c^ is updated for the first surviving state s' as follows: e^ is made equal to $p^{\wedge'} \oplus p^{\wedge''}$ if $\Delta < Me'$ or e^ is made equal to $e^{\wedge'}$ if $\Delta \geq Me'$ and wherein the surviving error path e^ is updated for second surviving stat s" as follows: e^ is made equal to $p^{\wedge} \oplus p^{\wedge}$ if $\Delta < Me''$ or e^ is made equal to $e^{\wedge''}$ if $\Delta \geq Me''$.

2. The method for decoding of claim 1, wherein the high rate product code has no parity bit per row.

3. The method for decoding of claim 1, wherein the high rate product code has one or more parity bits per row.

4. The method for decoding of claim 3, wherein the high rate product code has only one parity bit per column.

5. The method for decoding of claim 4, wherein the step of using the column processor to connect any remaining errors based on column parity bits and the most likely error sequence of each row comprises a first substep of creating a vector CS of check sums from check sums calculated for the Columns of the second iteration surviving code path p^, and a second substep of calculating vectors CCSE of check sums between the vector CS and each surviving error path e^.

6. The method for decoding of claim 5, claim wherein the step of using the column processor to correct any remaining errors based on column parity bits and the most likely error sequence of each row, comprises a third substep of terminating all decoding, if the vector CS=0, otherwise, finding a check sum vector GCSE with a minimum number of ones, choosing a corresponding row as an erroneous row, and, if there is more than one row with the minimum number of ones, choosing the row with the minimum Me as the erroneous row.

7. The method for decoding of claim 6, wherein the step of using the column processor to correct any remaining errors based on column parity bits and the most likely error sequence of each row comprises a fourth substep of correcting the erroneous row by setting it equal to $p^{\wedge} \oplus e^{\wedge}$.

8. The method for decoding of claim 7, further comprises a step of recreating the vector CS of check sums from check sums calculated for the columns of surviving code path p^.

9. The method for decoding of claim 8, wherein, if the vector of check sums CS=0, terminating the decoding process for the high rate product code; otherwise, repeating the steps of first, second, and third substeps of the step of using the column processor to correct any remaining errors based on column parity bits and the most likely error sequence of each row.

10. A method for decoding a high rate product code, comprising the steps of:

receiving the high rate product code y^;

using a row detector to find a most likely codeword and a most likely error sequence Me for each row including first generating a surviving code path p^ and delaying the high rate product code y^ and, second, inputting the surviving code path p^ and the delayed high rate product code y^ into a bank of matched filters to generate odd error patterns Eo1 and Eo2 of each ROW, AN even error pattern Ee1 of each row, metrics Mo1 and Mo2 of the odd error patterns, the surviving code path p^, each a metric Me1 of the even error pattern; and using a column processor to correct any remaining errors based on column parity bits and the most likely error sequence of each row, wherein the step of using the row detector comprises, third, inputting the odd error patterns Eo1 and Eo2, the even error pattern Ee1, the metrics Mo1 and Mo2 of the odd error patterns, and the metric Me1 of the even error pattern into a row post processor to generate a surviving error path e^, the surviving code path p^, and the metric of the most likely error sequence Me, wherein the step of generating the surviving error path error e^ and the metric of the most likely error sequence Me involves a determination as to whether a parity condition is met, wherein when the parity condition is not met, the surviving code path p^ is updated as $p^{\wedge} \oplus Eo1$, the most likely error sequence e^ is chosen as $Eo1 \oplus Eo2$ if $Me1 \geq Mo2$ or as Ee1 if Me1<Mo2, and the metric of the most likely error sequence Me is chosen as Mo2 if $Me1 \geq Mo2$ or Me1 is Me1<Mo2, and wherein when the parity condition is met, the surviving code path p^ remains the same as the most likely error sequence e^ is chosen as $Eo1 \oplus Eo2$ if $Me1 \geq Mo1+Mo2$ or as Ee1 if Me1<Mo1+Mo2, and the metric of the most likely error sequence Me is chosen as Mo1+Mo2 if $Me1 \geq Mo1+Mo2$ or as Me1 if Me1<Mo1+Mo2.

11. The method for decoding of claim 10, wherein the high rate product code has only one parity bit per row.

12. The method for decoding of claim 11, wherein the high rate product code has only one parity bit per column.

13. The method for decoding of claim 12, wherein the step of using the column processor to correct any remaining error based on column parity bits and the most likely error sequence of each row involves, as a first substep, creating a vector CS of check sums from check sums calculated for the columns of the surviving code path p^, then a second substep, calculating vectors CCSE of check sums between the vector CS and each surviving error path e^.

14. The method for decoding claim 13, wherein the step of using the column processor to correct any remaining errors based on column parity bits and the most likely error sequence of each row involves, as a third substep, if CS=0, terminating all decoding, otherwise, finding the check sum vectors CCSE with a minimum number of ones, choosing the corresponding row as an erroneous row, and, if these is more than one row with the minimum number of ones, choosing the row with the minimum Me as the erroneous row.

15. The method for decoding claim 14, wherein the step of using a column processor to correct any remaining errors based on column parity bits and the most likely error sequence of each row involves, as a third substep correcting the erroneous row by setting it equal to $p^{\wedge} \oplus e^{\wedge}$.

16. The method for decoding of claim 15, further comprises a step of recreating the vector CS of check sums from the check sums calculated for the columns of the surviving code path p^.

17. The method for decoding or claim 16, wherein, if the vector of check sums CS=0, terminating the decoding process for that high rate product code; otherwise, repeating the steps of first, second, and third substeps of the step of using a column processor to correct any remaining errors based on column parity bits and the most likely error sequence of each row.

* * * * *